United States Patent [19]
Gaglione et al.

[11] Patent Number: 5,783,874
[45] Date of Patent: Jul. 21, 1998

[54] KEYPAD HANDLING CIRCUITS

[75] Inventors: Philippe Gaglione, Mandelieu la Napoule; Laurent Souef, Opio; John Whittle, Valbonne, all of France

[73] Assignee: VLSI Technology, Inc., San Jose, Calif.

[21] Appl. No.: 643,756

[22] Filed: May 6, 1996

[51] Int. Cl.⁶ .................................................. H01H 19/04
[52] U.S. Cl. .................... 307/113; 307/112; 307/141; 341/22; 341/24; 326/38; 379/368
[58] Field of Search ................................ 307/112, 113, 307/141, 141.4, 141.8; 341/22, 20, 24; 326/82, 38, 17; 379/368

[56] References Cited

U.S. PATENT DOCUMENTS

| | | | |
|---|---|---|---|
| 4,357,496 | 11/1982 | Nahas | 327/107 |
| 4,777,375 | 10/1988 | Bozzuto | 250/551 |
| 4,959,831 | 9/1990 | Wroblewski | 341/26 |
| 4,974,482 | 12/1990 | Tamaki et al. | 84/653 |
| 5,128,558 | 7/1992 | Ovens et al. | 326/42 |

*Primary Examiner*—William M. Shoop, Jr.
*Assistant Examiner*—Albert W. Paladini
*Attorney, Agent, or Firm*—Burns, Doane, Swecker & Mathis, LLP

[57] ABSTRACT

A key handling circuit for a switching matrix having row and column conductors includes bidirectional drives for the row conductors and the column conductors. The row drive and the column drive are in a low conductive condition except when a relevant key switch is activated. The row drive provides a current input for the column drive in one phase of operation and the column drive provides a current input for a row drive in a second phase of operation.

12 Claims, 3 Drawing Sheets

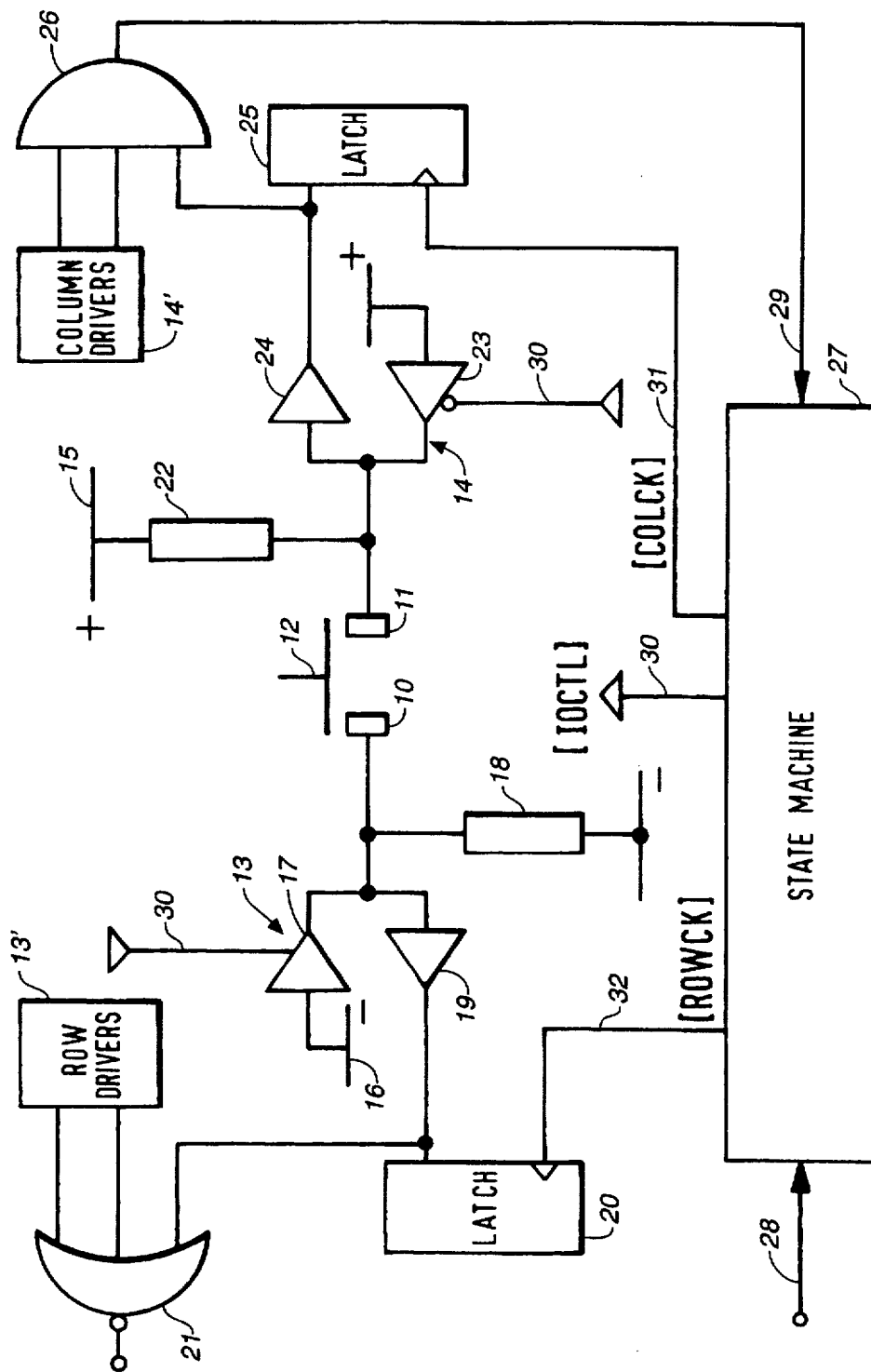
FIG._1

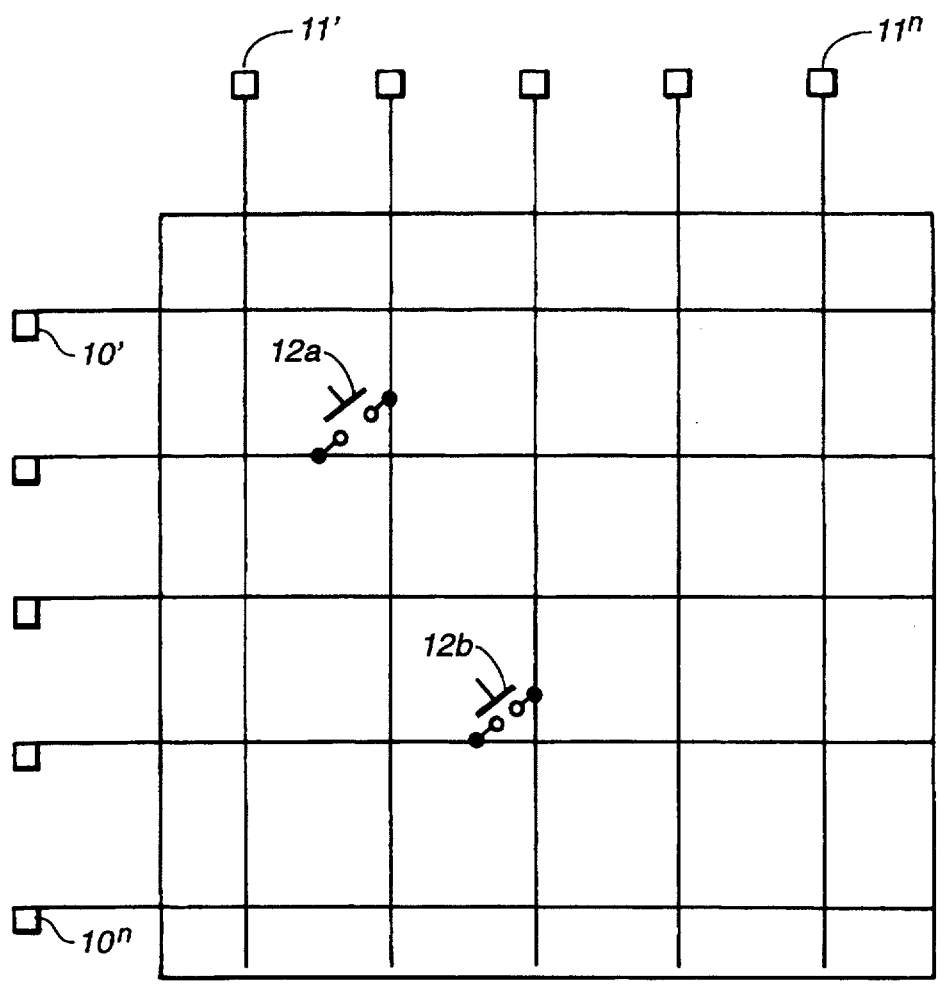
FIG._2

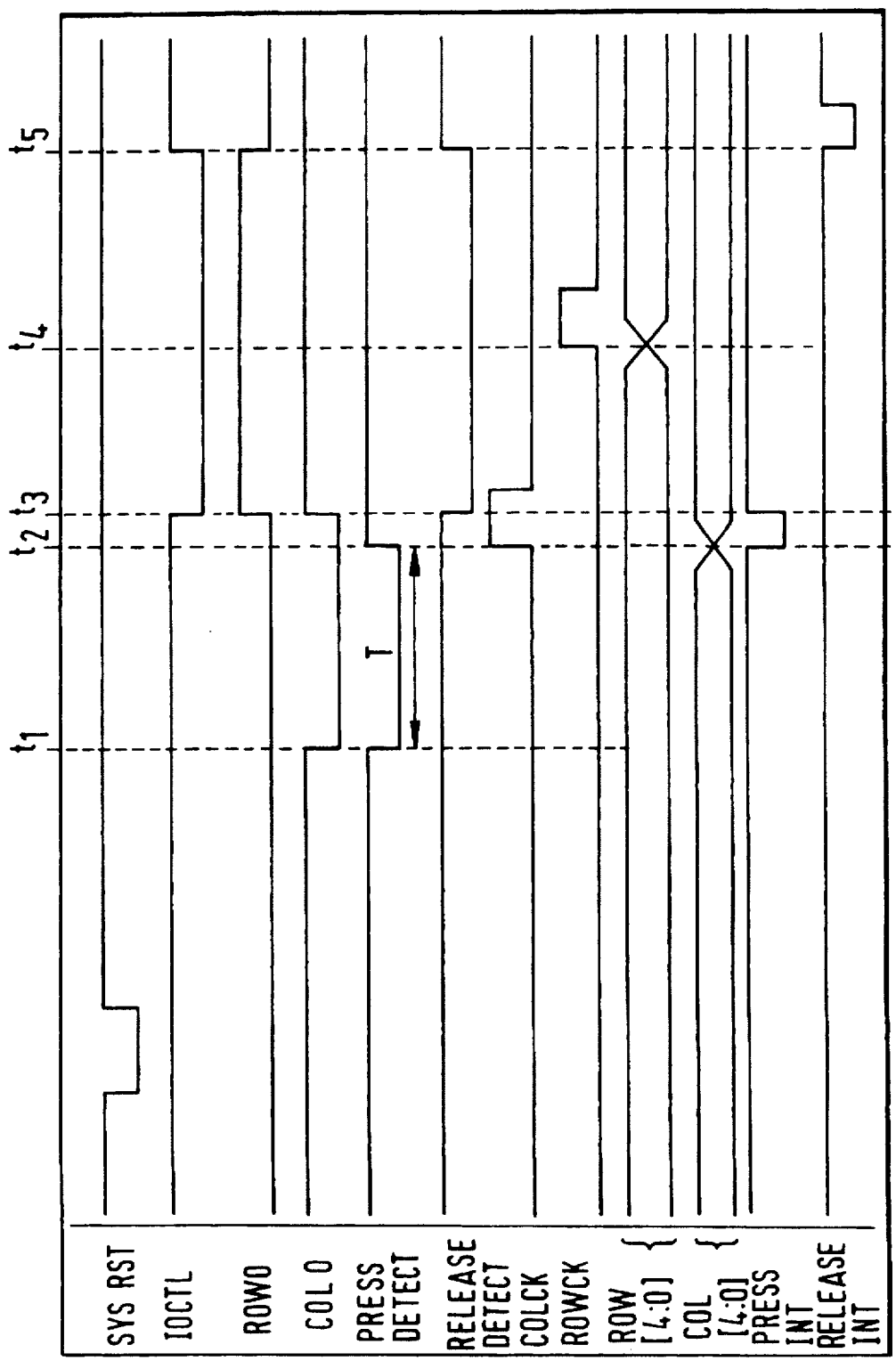
FIG._3

KEYPAD HANDLING CIRCUITS

FIELD OF THE INVENTION

This invention relates to handling circuits for keypads, that is to say circuits which respond to the operation of a key or section of a keypad to provide the output, and preferably temporary storage, of signals identifying the key which has been operated.

Keypads of this general nature are familiar in mobile telephones and many other kinds of keying equipment wherein an array of pads, keys or like operating devices are used to provide signals representing numerical or alphabet characters to a signal processing system.

It is commonplace for a keypad to be constituted by a switching matrix comprising two sets of conductors, conventionally called 'row' and 'column' conductors, the pads or other switch elements being arranged so as to produce a conductive connection between a first conductor, typically a 'row' conductor and a second conductor, typically a 'column' conductor.

However the invention is not limited to use with switching matrices and may be employed, for example, as a handling circuit for a single key switch.

BACKGROUND OF THE INVENTION

Keypads and key switches in mobile telephones and other mobile signalling equipment can represent a significant drain on the stored energy of the equipment. It is therefore desirable to provide a circuit which has potentially very low current consumption both during a dormant mode of the equipment and also during an operating mode. In particular, since equipment of this nature commonly includes a microprocessor, it is desirable to avoid repetitive scanning of the keypad circuits but to enable storage of any signal output identifying the depression of a key or keys until the microprocessor is rendered into an active mode at an interrupt.

It is therefore the object of the present invention to provide a keypad handling circuit which is asynchronous in operation and is configured for very low power consumption. A further object of the invention is to provide an improved 'debounce' circuit which avoids false detections.

A further object of the invention is to provide a keypad handling structure which can operate with a wide variety of keypads employing a switching matrix.

The invention is based on a bidirectional drive for both conductors, that is the respective row conductor and respective column conductor associated with each switching element. Both the row drive and the column drive can be in a low conductive condition except when a relevant key switch is activated. The row drive provides a current input for the column drive in one phase of operation and the column drive provides a current input for a row drive in a second phase of operation.

Other objects and features of the invention will become apparent from a consideration of the following description of a preferred embodiment and with reference to the accompanying drawings.

BRIEF DESCRIPTION OF THE DRAWINGS

FIG. 1 is a schematic circuit diagram illustrating one embodiment of a keypad handling circuit according to the invention;

FIG. 2 illustrates schematically a multi-row, multi-column keypad; and

FIG. 3 is a timing diagram.

DETAILED DESCRIPTION OF A PREFERRED EMBODIMENT

FIG. 1 illustrates a handling circuit for a particular pair of conductors, 10 and 11, of which the conductor 10 will be termed for convenience a row pin and the terminal 11 will be termed a column pin. Typically, the row and column pins 10 and 11 are terminals of a respective row line and column line in an N-by-N keypad switching matrix which has, as schematically illustrated in FIG. 2, N row conductors 10' to 10"and a plurality of column conductors 11' to 11". Each keypad or keyswitch in the array is adapted to make a conductive connection between a row conductor and a column conductor so that the pad or key 12 which is operated is uniquely identified by the combination of the row and column to which the underlying or associated switch is connected.

An N by N matrix can obviously accommodate up to $N^2$ key pads but it is obviously not necessary for every combination of row and column to be associated with a keypad and associated switch. For the sake of simplicity, only two keypad switches 12a and 12b are shown in FIG. 2. However, as will be seen, one advantage of the invention is, in its preferred form, very low power consumption and adaptability to a wide variety of switching matrices whether the switches are directly or indirectly operated by the key pads.

The switching matrix shown in FIG. 2 is coupled to a plurality of row driver circuits, one for each row line and a plurality of column driver circuits, one for each column line. The row driver circuits are all similar and the column driver circuits are all similar, so that only the row driver circuit and the column driver circuit associated with a key to be operated need be described with reference now to FIG. 1.

As will be explained hereinafter, the column and row driver circuits are connected to a common key press detector, a common key release detector and a common state machine.

FIG. 1 therefore shows a row driver circuit 13 connected to a respective row pin 10 which by means of a particular key 12 can be conductively connected to a column pin 11 having a column driver circuit 14. Typically the pins 10 and 11 are external pins on the keypad structure, the internal configuration of which is not directly relevant to the present invention.

The driver circuits are connected, as described later, to a pair of supply rails, herein denoted the positive supply rail 15 and the negative supply rail 16. For convenience, the positive rail 15 is denoted herein 'HIGH' and the negative rail 16 is denoted 'LOW'. The voltages selected for these rails depend on the technical realization of the circuit, but would preferably be appropriate for CMOS circuits.

Associated with the row terminal pin 10 is the bidirectional row driver circuit 13 comprising a driver 17 connected between the negative or LOW supply rail 16 and the row terminal pin 10, which is connected by way of a pull-down resistor 18 to the negative rail 16. A second driver 19 has an input connected to the row terminal pin 10 and an output connected to a data input of a bistable latch 20 and to one input of a gate 21, which acts as a key release detector. This gate has a multiplicity of inputs, corresponding to the number of row lines, the other lines being connected to the second row driver 19 in each of the other row driver circuits (shown in FIG. 1 as circuits 13').

In the column driver circuit 14, the column pin 11 is connected to the positive supply rail 15 by a pull-up resistor 22. The positive supply rail 15 is also connected to the column pin 11 by way of a first column driver 23. The column driver circuit is also bidirectional and accordingly the column pin 11 is connected to the input of a second column driver 24 of which the output is coupled to a data input of a bistable latch 25. The output of the second column driver is also coupled to one input of an AND gate 26 of which the other inputs are connected to the second column drivers 24 of the column driver circuits (14') for the other column lines.

The particular circuits shown require for the preferred manner of operation three enabling signals. These are an input/output control signal IOCTL; a clock pulse signal COLCK which is applied to the bistable latches 25 of each of the column driver circuits; and a clock pulse signal ROWCK. The input/output control signal IOCTL is a binary signal which enables either the driver 17 or the driver 23 according to its binary state and thereby controls the two-phase operation of the row and column drivers. The signal COLCK enables the latching of the column outputs into the column registers constituted by the latches 25 (of which only one is shown). The signal ROWCK enables the latching of the row outputs into the row registers constituted by the latches 20 (of which only one is shown). These signals IOCTL, COLCK and ROWCK are provided by a state machine 27 which receives a power-up reset signal on a line 28 and the output of the gate 26 on a line 29 and provides the signals IOCTL, COLCK and ROWCK on lines 30–32 respectively. The particular construction of the state machine is not important and its required operation will be obvious from the following description of the operation of the circuits 13 and 14.

The operation of the circuits shown in FIG. 1 is preferably as follows.

The pull-down resistor 18 keeps the row pin 10 normally LOW and the pull-up resistor 22 keeps the column pin normally HIGH.

The input/output control signal is normally in a HIGH state, and the row driver 17 drives a LOW signal into the pull-down resistor 18. In effect the driver 17 and resistor 18 form a loop with substantially no net electromotive force, so that no current flows in the loop.

When the key 12 is operated (at time t1 in FIG. 3) to connect the row pin 10 with the column pin 11, current can flow into the row driver 17 through the switch connection, since the column pin is pulled HIGH by resistor 18; the column output COLO (at the output of the second column driver 24) is driven LOW and therefore the 'Press Detect' output of the AND gate 26 also goes LOW, having previously been kept HIGH by HIGH signals on all its inputs.

Preferably, the keypress detector gate 26 initiates by way of a state machine the single clock pulse COLCK, which is coupled to the clock inputs of all the bistable latches 25 of the column handling circuits. Thus the column information will be latched into the register constituted by these bistable latches. One of the latches will store a LOW signal shown as COL [4:0] in FIG. 3 and the remainder will each store a HIGH signal.

The column clock signal COLCK is preferably a single pulse generated at time $t_2$ after a selected delay, i.e. a debounce time set to avoid false operation and uncertain or repeated switch contact. Slightly after the debounce time (T in FIG. 3) the state machine forces the input/output control signal (IOCTL) LOW at time $t_3$. The row drivers 17 and 19 are disabled and column drivers are now enabled, the drive direction being thereby reversed. The column drivers will drive a HIGH state into the pull-up resistor 22 so that no current will flow in the column pins except for that connected by the key 12 to a row pin. A HIGH signal is produced at the output of the column driver 24, so that the output of gate 26 reverts to HIGH. This LOW to HIGH transition may be used to produce an interrupt signal, denoted 'Press Int' in FIG. 3. Current is driven into the pull down resistor 18 of that row to which key 12 is connected.

The output (ROW0) of driver 19 of the selected row is now HIGH because its input coupled to pin 11 is driven HIGH by driver 23. A HIGH signal is input from driver 19 to the row latch 20 and is latched, as shown by ROW[4:0] signal in FIG. 3, in response to the ROWCK signal, which may be a single pulse provided at time $t_4$ either at some controlled time after the HIGH to LOW transition of the input/output signal.

The outputs of the row driver 19 and each of the corresponding row drivers from the inputs are coupled to the OR gate 21, which constitutes a key release detector. The output of the gate 21 ('Release Detect') will be LOW when the output of driver 19 goes HIGH and will revert to a HIGH state when the key 12 is released at time $t_5$, cutting off the current from pin 11 to driver 19 and allowing the input and output of driver 19 to revert to the normal low state. The LOW to HIGH transition of the output of gate 21 may be used to generate an interrupt signal, shown as 'Release Int' in FIG. 3.

Thus it will be seen that owing to the bidirectional two-phase drive scheme no current flows in the drivers until a key is operated and current only flows in the selected row/column connection. The circuit is substantially immune to contact bounce. The selected row/column connection is identified by a single LOW in the column register and a single HIGH in the row register (or vice versa, depending on which lines are regarded as the row lines and which set of lines are regarded as the column lines).

What is claimed is:

1. A key switch circuit comprising:
   a first conductor and a second conductor for connection by a switch element;
   a first supply rail and a second supply rail;
   a first current driver having an input coupled to said first supply rail and an output coupled to said first conductor;
   a second current driver having an input, which is connected to said first conductor, and an output;
   a first resistive means connecting said first conductor to said first supply rail;
   a third current driver having an input coupled to said second supply rail and an output coupled to said second conductor;
   a fourth current driver having an input, coupled to said second conductor, and an output;
   a second resistive means connecting said second conductor to said second supply rail; and
   circuit means coupled to the outputs of the second current driver and the fourth current driver for enabling said first current driver to provide a current input for said fourth current driver and for enabling said third current driver to provide a current input for said second current driver.

2. A circuit according to claim 1 wherein said circuit means includes means for alternately enabling and disabling said first and third current drivers.

3. A circuit according to claim 1 wherein said first supply rail is a relatively low voltage rail and said second supply rail is a relatively high voltage rail.

4. A circuit according to claim 1 and further comprising first signal storage means connected to receive the output of said second driver and second signal storage means connected to receive the output of said fourth driver.

5. A circuit according to claim 4 wherein said circuit means includes means responsive to an active output from said fourth driver to initiate after a predetermined delay a clock signal enabling the output of said fourth driver to be latched into said second storage means, to cause the disabling of said first driver and the enabling of said third driver, and to initiate a clock signal enabling the output of said second driver to be latched into said first storage means.

6. A circuit according to claim 1 and further comprising means responsive to a selected transition of the output of said second driver, said transition denoting release of said connection, to provide an interrupt signal.

7. A keypad handling circuit for use with a switching matrix having a plurality of row lines, a plurality of column lines and a multiplicity of switch means each operable to connect a selected row line to a selected column line, said circuit comprising:

(i) a first supply rail and a second supply rail;

(ii) for each row line, a bidirectional drive circuit comprising:
a first current driver having an input coupled to said first supply rail and an output coupled to said row line, a second current driver having an input coupled to said row line and an output, and resistive means coupling said row line to said first supply rail;

(iii) for each column line, a bidirectional drive circuit comprising:
a third current driver having an input coupled to said second supply rail and an output coupled to said column line, a fourth current driver having an input coupled to said column line and an output, and resistive means coupling said column line to said second supply rail; and (iv) means coupled to the outputs of the second current driver and the fourth current driver for enabling and disabling said first and third current drivers, whereby while a respective selected row line is connected to a respective selected column line the first current driver provides an input for said fourth current driver and said third current driver provides a current input for said second current driver.

8. A circuit according to claim 7 and further comprising first signal storage means connected to receive the output of said second driver and second signal storage means connected to receive the output of said fourth driver.

9. A circuit according to claim 7 and further comprising means responsive to an active output from said fourth driver to initiate after a predetermined delay a clock signal enabling the output of said fourth driver to be latched into said second storage means, to cause the disabling of said first driver and the enabling of said third driver, and to initiate a clock signal enabling the output of said second driver to be latched into said first storage means.

10. A keypad handling circuit for use with a switching matrix having a plurality of row lines, a plurality of column lines and a multiplicity of switch means each operable to connect a selected row line to a selected column line, said circuit comprising:

(a) for each row line, a bidirectional drive circuit comprising a first current driver having an input coupled to a first supply rail and an output coupled to said row line, a second current driver having an input coupled to said row line and an output, and circuit means for causing said first and second drivers to be in a low conductive state;

(b) for each column line, a bidirectional drive circuit comprising a third current driver having an input coupled to a second supply rail and an output coupled to said column line, a fourth current driver having an input coupled to said column line and an output, and circuit means for causing said third and fourth drivers to be in a low conductive state; and (c) means coupled to the outputs of said second current driver and said fourth current driver for enabling and disabling said first and third current drivers while a respective selected row line is connected to a respective selected column line;

whereby said first current driver, when thus enabled, provides an input for said fourth current driver and said third current driver, when thus enabled, provides a current input for said second current driver.

11. A circuit according to claim 10 and further comprising first signal storage means connected to receive an output of said second driver and second signal storage means connected to receive an output of said fourth driver.

12. A circuit according to claim 10 and further comprising means responsive to said output from said fourth driver to initiate after a predetermined delay a clock signal enabling the output of said fourth driver to be latched into said second storage means, to cause the disabling of said first driver and the enabling of said third driver, and to initiate a clock signal enabling the output of said second driver to be latched into said first storage means.

* * * * *